(12) United States Patent
Chu et al.

(10) Patent No.: US 10,170,712 B2
(45) Date of Patent: Jan. 1, 2019

(54) ARTICLES HAVING FLEXIBLE SUBSTRATES

(71) Applicant: HEWLETT-PACKARD DEVELOPMENT COMPANY, L.P., Houston, TX (US)

(72) Inventors: Wei Kuang Chu, Taipei (TW); Kuan-Ting Wu, Taipei (TW); Kevin Voss, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/563,969

(22) PCT Filed: May 27, 2015

(86) PCT No.: PCT/US2015/032563
§ 371 (c)(1),
(2) Date: Oct. 3, 2017

(87) PCT Pub. No.: WO2016/190855
PCT Pub. Date: Dec. 1, 2016

(65) Prior Publication Data
US 2018/0138430 A1    May 17, 2018

(51) Int. Cl.
*H01L 27/32* (2006.01)
*H01L 51/00* (2006.01)
(Continued)

(52) U.S. Cl.
CPC ........ *H01L 51/0097* (2013.01); *G02F 1/0147* (2013.01); *H01L 33/46* (2013.01);
(Continued)

(58) Field of Classification Search
CPC .............. H01L 25/048; H01L 27/3232; H01L 51/0097; H01L 51/5262; H01L 2251/5338
See application file for complete search history.

(56) References Cited

U.S. PATENT DOCUMENTS 5,914,197 A    6/1999   Gougjil
6,249,222 B1   6/2001   Gehlot
(Continued)

FOREIGN PATENT DOCUMENTS

KR    10-2008-0081255 A    9/2008

OTHER PUBLICATIONS

"Patented Photochromic Color Change Solar UV Sensor UV Tester Wristband UV Bracelet Watch Promotion Gift & Premeium & Giveaways"; 2 pages; Jan. 23, 2015.

*Primary Examiner* — Hoai V Pham
(74) *Attorney, Agent, or Firm* — HPI Patent Department

(57) ABSTRACT

Provided in one example is an article. The article includes a substrate. The article includes a first layer disposed over at least a portion of the substrate, the first layer comprising a reflector. The article includes a second layer disposed over at least a portion of the first layer, the second layer comprising an electrode. The article includes a third layer disposed over at least a portion of the second layer, the third layer comprising a polymer and a light source. The article includes a fourth layer disposed over at least a portion of the third layer, the fourth layer comprising a diffusor. The article includes a fifth layer disposed over at least a portion of the fourth layer, the fifth layer comprising at least one of a photochromic material and a thermochromic material.

15 Claims, 5 Drawing Sheets

(51) Int. Cl.
  *G02F 1/01*    (2006.01)
  *H01L 51/52*   (2006.01)
  *H01L 33/46*   (2010.01)
  *H01L 33/58*   (2010.01)
  *H01L 33/62*   (2010.01)
  *H01L 51/56*   (2006.01)
  *G04B 37/14*   (2006.01)
  *G04G 9/00*    (2006.01)
  *H01L 25/04*   (2014.01)
  *H01L 25/075*  (2006.01)
  *H01L 27/15*   (2006.01)

(52) U.S. Cl.
  CPC .............. *H01L 33/58* (2013.01); *H01L 33/62* (2013.01); *H01L 51/5262* (2013.01); *H01L 51/5268* (2013.01); *H01L 51/5271* (2013.01); *H01L 51/56* (2013.01); *G02F 2202/14* (2013.01); *G04B 37/1486* (2013.01); *G04G 9/00* (2013.01); *H01L 25/048* (2013.01); *H01L 25/0753* (2013.01); *H01L 27/153* (2013.01); *H01L 27/3204* (2013.01); *H01L 51/5206* (2013.01); *H01L 51/5221* (2013.01); *H01L 2251/5338* (2013.01); *H01L 2933/0091* (2013.01); *Y02E 10/549* (2013.01); *Y02P 70/521* (2015.11)

(56) References Cited

U.S. PATENT DOCUMENTS

| | | |
|---|---|---|
| 7,044,614 B2 | 5/2006 | Levy et al. |
| 8,158,224 B2 | 4/2012 | Zhang et al. |
| 2001/0008074 A1 | 7/2001 | Radley-Smith |
| 2006/0146514 A1 | 7/2006 | Douglas |
| 2009/0143516 A1 | 6/2009 | MacDonald et al. |
| 2010/0156765 A1 | 6/2010 | Park et al. |
| 2013/0034836 A1 | 2/2013 | Marshall |
| 2014/0179225 A1 | 6/2014 | Teng et al. |
| 2016/0056414 A1* | 2/2016 | Harikrishna Mohan ............ H01L 51/0097 257/40 |

* cited by examiner

Forming an article by:
   disposing over at least a portion of a substrate a first layer, the first layer comprising a reflector;
   disposing over at least a portion of the first layer a second layer, the second layer comprising an electrode;
   disposing over at least a portion of the second layer a third layer, the third layer comprising a polymer and a light source;
   disposing over at least a portion of the third layer a fourth layer, the fourth layer comprising a diffusor; and
   disposing over at least a portion of the fifth layer a fourth layer, the fifth layer comprising at least one of a photochromic material and a thermochromic material

S301

Assembling the article with a display to form an electronic device

ARTICLES HAVING FLEXIBLE SUBSTRATES

BACKGROUND

Watches and other wearable electronic devices have begun to offer functionalities beyond simple display of the time. For example, some watches have incorporated keyboards and offer the ability to store and retrieve information such as addresses and phone numbers. In some instances, a wearable electronic device may contain a processor and act as a portable computing device.

BRIEF DESCRIPTION OF THE DRAWINGS

The drawings are provided to illustrate various examples of the subject matter described herein in this disclosure (hereinafter "herein" for short) related to articles having flexible substrates, particularly those for electronic devices, and are not intended to limit the scope of the subject matter. The drawings are not necessarily to scale.

FIG. 3 provides a flowchart showing, in one example, the processes involved in making an electronic device containing the article described herein.

DETAILED DESCRIPTION

Figure 1A:
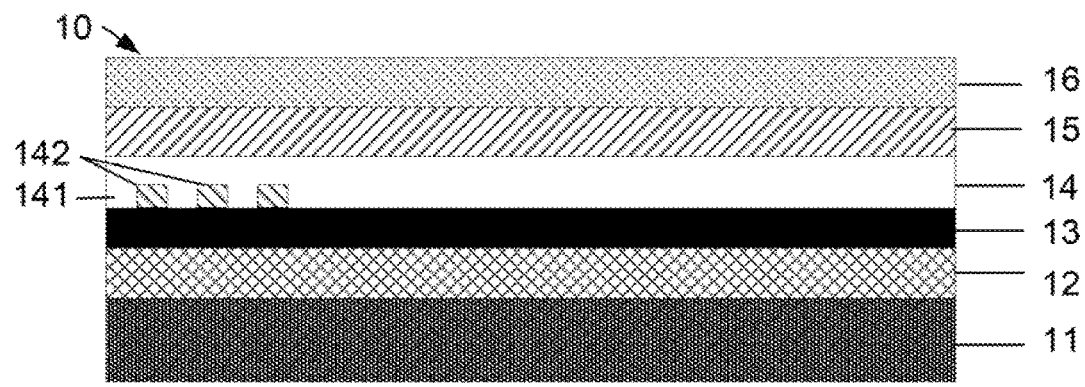
FIGS. 1A-1E show schematics of different examples of the article described herein.

The pre-existing wearable electronic devices may contain a display, which is connected by a band similar to the band of a watch. The display may contain a processor, so that the display may function as a small computer. An example of such a wearable electronic device is a "smart watch." However, the pre-existing bands of such wearable electronic devices generally are made of a rubber or a leather, which may lack aesthetic appearance.

In view of the aforementioned challenges related to pre-existing wearable electronic devices, the inventors have recognized and appreciated the advantages of a wearable electronic device containing a flexible "smart" band, which may contain a photochromic and/or a thermochromic material in combination with a light-emitting diode ("LED") and/or an organic light-emitting diode (OLEE") light source and Internet of Things ("IoT") technology. Following below are more detailed descriptions of various examples related to articles comprising a flexible substrates, particularly those for an electronic device. The various examples described herein may be implemented in any of numerous ways.

Provided in one aspect of the examples is an article, comprising: a flexible substrate; a first layer disposed over at least a portion of the substrate, the first layer comprising a reflector; a second layer disposed over at least a portion of the first layer, the second layer comprising an electrode; a third layer disposed over at least a portion of the second layer, the third layer comprising a polymer and a light source; a fourth layer disposed over at least a portion of the third layer, the fourth layer comprising a diffusor; and a fifth layer disposed over at least a portion of the fourth layer, the fifth layer comprising at least one of a photochromic material and a thermochromic material.

Provided in another aspect of the examples is an electronic device, comprising: a display; a flexible article connected to the display, the article comprising: a flexible substrate; a first layer disposed over at least a portion of the substrate, the first layer comprising a reflector; a second layer disposed over at least a portion of the first layer, the second layer comprising an electrode; a third layer disposed over at least a portion of the second layer, the third layer comprising a polymer and a light source; a fourth layer disposed over at least a portion of the third layer, the fourth layer comprising a diffusor; and a fifth layer disposed over at least a portion of the fourth layer, the fifth layer comprising at least one of a photochromic material and a thermochromic material.

Provided in another aspect of the examples is a method of manufacturing, comprising forming an article by: disposing over at least a portion of a substrate a first layer, the first layer comprising a reflector; disposing over at least a portion of the first layer a second layer, the second layer comprising an electrode; disposing over at least a portion of the second layer a third layer, the third layer comprising a polymer and a light source; disposing over at least a portion of the third layer a fourth layer, the fourth layer comprising a diffusor; and disposing over at least a portion of the fifth layer a fourth layer, the fifth layer comprising at least one of a photochromic material and a thermochromic material; and assembling the article with a display to form an electronic device.

Article with a Flexible Substrate

The article as described herein may have various and any suitable configurations. FIGS. 1A-1E illustrate several example configurations of the article described herein. It is noted that the terms "first," "second," "third," etc. herein are merely used to connote that the objects they respectively describe are different entities and are not meant to describe any chronological order, unless explicitly specified.

The article 10 may comprise a flexible substrate 11. A "flexible" object herein may refer to the object having sufficient elasticity that under normal use of the object, the object would undergo elastic deformation, returning to its original shape without permanent/plastic deformation. The relatively high flexibility of the objection may be reflected by the relatively high yield strength and/or Young's modulus of the object material. The values of the yield strength and Young's modulus are not limited and may vary depending on the material involved. For example, the flexible substrate herein may comprise at least one a polyurethane ("PU"), a polyethylene terephthalate ("PET"), a polyethylene naphthalate ("PEN") a polyimide ("PI"), a synthetic paper, a polycarbonate, a polyacrylic (e.g., a polymethylmethacrylate ("PMMA")), a poly(ether sulfone), a rubber, a polyolefin, and an elastic polymer. Other materials are also possible.

The article 10 may further comprise a first layer 12 disposed over at least a portion of the substrate 11. The first layer 12 may comprise a reflector. The reflector may, for example, a specular surface reflector. The reflector may be any material that reflects a certain amount light exceeding a certain threshold value. For example, the reflector (and in some instances the first layer 12) may reflect (e.g., has a reflectance of) greater than or equal to about 90% of an incident light—e.g., at greater than or equal to about 95% about 96%, about 97%, about 98%, about 99%, or higher. The incident light may be, for example, a back light.

The reflector may be in the form of a layer or a laminate of multiple layers. The reflector may comprise any suitable material. For example, the reflector may comprise a polymer. In one example, the polymer is at least one of a polyethylene terephthalate ("PET"), an acrylic, and a polyester. In one example, the polymer may be further coated with nanoparticles. The nanoparticles may have any suitable color, depending on the optical property desired. For example, the nanoparticles may be white, silver, etc. In one example, the reflector comprises Vikuiti™ Enhanced Specular Reflector ("ESR") by 3M, USA. In one example, the reflector comprises a microfoamed PET, such as MC-PET by Furukawa Electric Co., Ltd, Japan. Other materials are also possible.

The article 14 may further comprise a second layer 13 disposed over at least a portion of the first layer 12. The second layer 13 may comprise an electrode. The electrode may comprise any suitable material. For example, the material may be an (electrically) conductive material. The electrically conductive material may comprise an inorganic material, an organic material, or both. The electrically conductive material may also be in any suitable shape or form—e.g., mesh, sheets (e.g., layers), wires, particles, etc. In one example, the electrode comprises at least one of a conductive polymer layer, a graphene layer, a metal-containing mesh, and a plurality of metal-containing wires. In one example, the electrically conductive polymer is poly(3,4-ethylene dioxythlophene): polystyrene sulfonate ("PEDOT: PSS"). In one example, the metal-containing mesh and/or wires comprise an electrically conductive metal, including silver, copper, etc. Other materials are also possible.

The article 10 may further comprise a third layer 14 disposed over at least a portion of the second layer 13. The second layer 13 may comprise a polymer 141 and a light source 142. The polymer 141 may be any suitable polymeric material, depending on the application, including, for example, an optically clear adhesive or resin, a light guide plate, etc. For example, the polymer may comprise at least one of an acrylic, a polycarbonate, an epoxy, a silicone, an epoxy/silicone mixture, a urea resin, a polymethylmethacrylate, an olefin polymer, and an acrylic-polystyrene copolymer. In one example, the optically clear adhesive or resin comprises at least one of an acrylic, a polycarbonate, an epoxy, a silicone, an epoxy/silicone mixture, and a urea resin. In one example, the light guide plate comprises at least one of a PMMA, a polycarbonate, an olefin polymer, and an acrylic-polystyrene copolymer. Other materials are also possible.

Figure 1B:
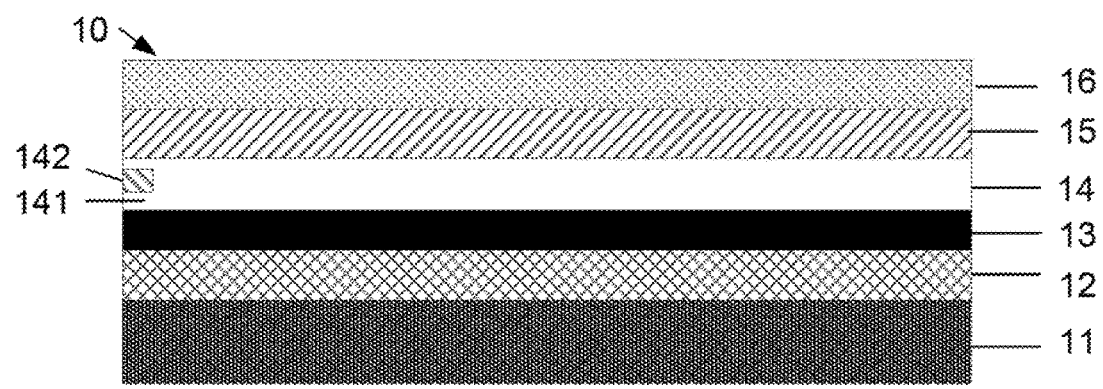

The light source 142 may comprise any suitable material that emits light. For example, the light source 142 may comprise at least one light-emitting diode ("LED"), organic light-emitting diode ("OLED"), or both. The light source may be placed any suitable location inside the third layer 14. In one example, as shown in FIG. 1A, the light source comprises a plurality of diodes disposed over a first side of the third layer 14—the first side parallels (and is along) the length (as shown in the figure) of the second layer 13. In another example, as shown in FIG. 1B, the light source comprises a diode disposed over a second side of the third layer 14—the second side is perpendicular to the aforementioned first side. The diode(s) of the light source 142 may be in electrical contact with the electrode of the second layer 13. The electrical contact may take the form of a direct, physical contact, or may take the form of an indirect physical contact (e.g., through an electrical connection, such as a metal wire).

Figure 1C:
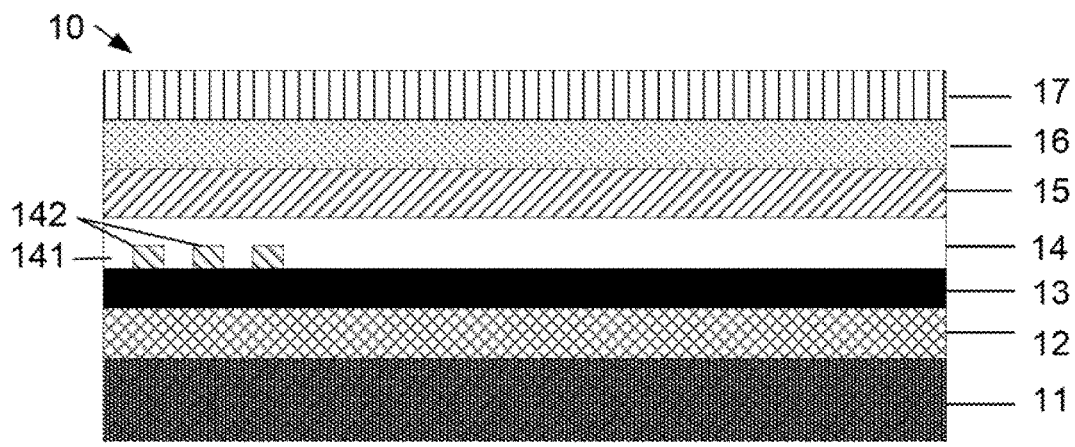
Figure 1D:
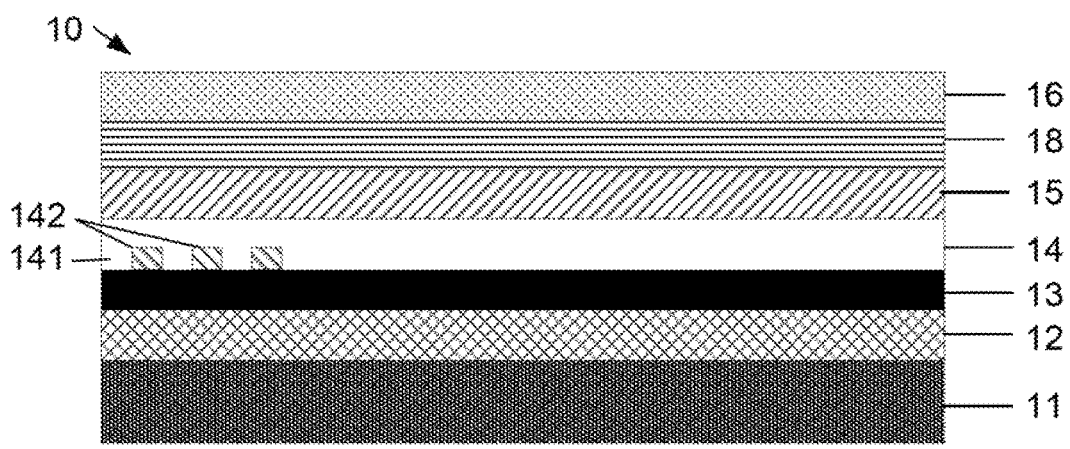
Figure 1E:
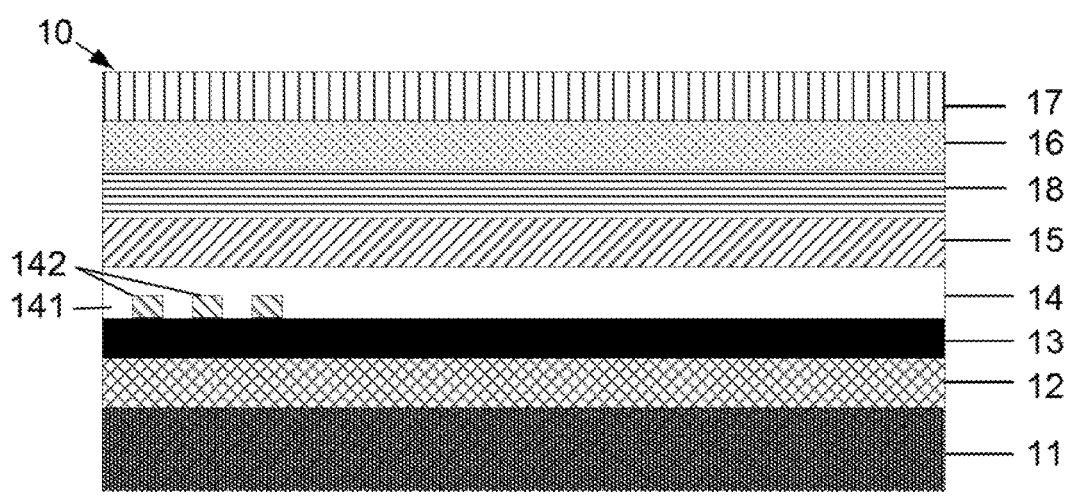

It is noted that while FIG. 1A shows a plurality of diodes as the light source 142 and FIG. 1B shows one diode as the light source 142, any number of diodes may be employed as a light source. It is further noted that while in FIGS. 1A-1B, each of the diode is shown as positioned perpendicular to an edge (or side), be it the first side or the second side, the diode may be positioned at any desired angle. Further, although, for the sake of convenience FIGS. 1C-1E illustrate the light source as that shown in FIG. 1A, the configurations as shown in FIGS. 1A and 1B are applicable to all of FIGS. 1C-1E (and any other figures provided herein).

Because of the orientation, in at least one example, the configuration as shown in FIG. 1A is referred to as "direct lit"—because the light is emitted upward in the figure, leaving the topmost surface of the article 10 into a user's view, which is above the topmost surface. On the other hand, in at least one example, the configuration as shown in FIG. 1B is referred to as "edge lit"—because the light is emitted at an angle from an "edge" of the layer 14 (and thus the article 10).

The article 10 may further comprise a fourth layer 15 disposed over at least a portion of the third layer 14. The fourth layer 13 may comprise a diffusor. The diffusor may comprise any suitable material. The material of the diffusor may be at least one polymer. The polymer may be one of a polycarbonate and a polyethylene terephthalate ("PET"). The polymer may further have a plurality of optical beads attached to the polymer. The optical beads may comprise any suitable material. For example, the optical beads may comprise glass, a polymer, or both. The polymer of the optical beads may be polystyrene, polystyrene/polyacrylate copolymer, etc. Other materials are also possible.

The article 10 may further comprise a fifth layer 16 disposed over at least a portion of the fourth layer 15. The fifth layer 13 may comprise at least one of a photochromic material and a thermochromic material. The photochromic material may be any suitable material exhibiting photochromic properties. A photochromic material may be a synthetic material that is used in applications in which a sunlight-induced reversible color change or darkening is desired. For example, the photochromic material may be a chromene. The photochromic material may comprise a chromene derivative, including certain benzopyrans and naphthopyrans. The photochromic material may be a derivative of a chromene and may undergo a color change—e.g., from colorless to yellow-orange, on irradiation by ultraviolet light at temperatures below about −40° C. Irradiation of the photochromic material with visible light or upon raising the temperature to within the range of −10° C. to 0° C. may reverse the coloration to a colorless state. In one example, the photochromic material is a spiropyran in which two cyclopropyl groups are appended to the position adjacent to the oxygen in the pyran ring. In another example, the photochromic material is a 2H-chromene as precursor of certain chroman-4-aldehydes, which are reacted with certain amines to prepare 4-aminomethylene-chromans and -chromenes that are used in medicaments. In one example, the photochromic material comprises at least one of a spiropyran, a spirooxazine, and a naphthopyran. Other materials are also possible.

The thermochromic material may be any suitable material exhibiting thermochromic properties. The thermochromic material may comprise an inorganic material, an organic material, or both. In one example, the thermochromic material comprises at least one of an N-acyl leuco-methylene blue derivative, a fluoran dye, a fulgide, a spirolactone, a crystal violet lactone analogue, a diphenylmethane compound, a spiropyran compound, a 1,2,3-benzotriazole, a dibenzotriazole, a thiourea, a saccharin or a derivative thereof, a halohydrins boric acid or a derivative thereof, a guanidme derivative, a 4-hydroxy coumarin derivative, a cholesteric liquid crystal, and a chiral nematic liquid crystal. In another example, the thermochromic material comprises a vanadium (IV) oxide. The vanadium (IV) oxide may containing an impurity agent (e.g., dopant). The impurity agent may have any suitable chemistry, depending on the application. In one example, the impurity agent is at least one of tungsten oxide, niobium (V) oxide, molybdenum oxide, gold, zinc oxide, cerium oxide, titanium oxide, and fluorine.

Figure 2A:
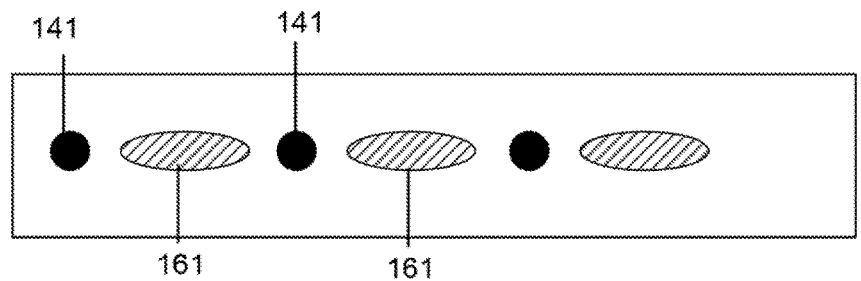
FIGS. 2A-2D show schematics of different example configurations of light sources and polymers in a specific layer of the article described herein.
Figure 2B:
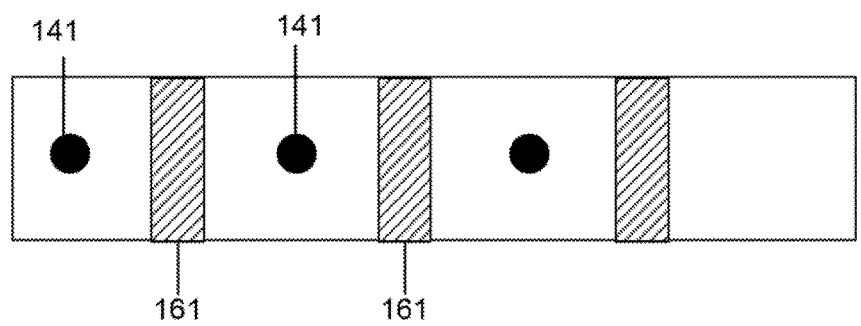
Figure 2C:
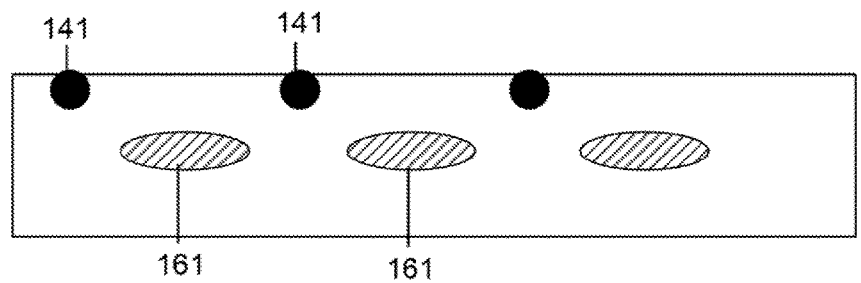
Figure 2D:
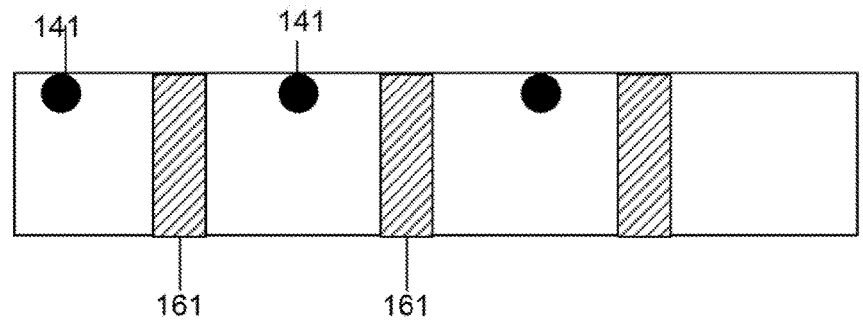

FIGS. 2A-2D are schematic diagrams illustrating top views of specific example configurations of the light source 141 in the third layer 14 and the photochromic/thermochromic material 161 of the fifth layer 16. It is noted that FIGS. 2A-2B are meant to illustrate only the configurations of the light source 141 and the photochromic/thermochromic material 161, and thus these figures omit all other components of the article just for the purpose of illustration. As shown in FIGS. 2A-2D, at least in some examples, the fifth layer 16 need not be a continuous layer, and instead may comprise a plurality of discrete photochromic/thermochromic materials 161. Specifically, FIGS. 2A-2B are based on the "direct lit" example as shown in FIG. 1A, whereas FIGS. 2C-2D are based on the "edge lit" example as shown in FIG. 1B. As shown in FIGS. 2A and 2C, the photochromic/thermochromic materials 161 takes the form of discrete materials separated by the light source 141 and not in contact with the top and bottom edges (as illustrated in the figures—on the same plane in reality). On the other hand, as shown in FIGS. 2B and 2D, the photochromic/thermochromic materials 161 takes the form of discrete materials separated by the light source 141 and are in contact with the top and bottom edges (as illustrated in the figures—on the same plane in reality). The polymer 142 may contain specific design (e.g., logos, designed pictures, etc.) that is presented and/or illustrated when the polymer is lit by the light source 141. In one example, the at least one of photochromic material and thermochromic material 161 of the fifth layer comprises a plurality of discrete designs, each separated by at least one of the plurality of discrete diodes.

The article, may comprise additional layer(s). As shown in FIG. 1C, the article 10 may further comprise a sixth layer 17 disposed over at least a portion of the fifth layer 16. In the example as illustrated in this figure, this sixth layer 17 may be the outermost layer of the article. As shown in this figure, this sixth layer 17 may serve to protect the underlying layers of the article from the environment. The sixth layer 17 may comprise any suitable material. For example, the sixth layer 17 may comprise a polymer. In one example, the sixth layer 17 comprises at least one of a polyethylene terephthalate ("PET"), a polyethylene naphthalate ("PEN"), a polyethylene ("PE"), a polypropylene ("PP"), a polyethersulfone ("PES"), a polyimide ("PI") and a polystyrene ("PS"). Other materials are also possible.

The sixth layer of the article need not be the outermost layer. FIG. 1D illustrates a configuration wherein the sixth layer 18 is disposed between the diffusor of the fourth layer 15 and the photochromic/thermochromic material of the fifth layer 16. Depending on the desired application, the sixth layer 18 as illustrated in FIG. 1D may comprise any suitable material. The material of the sixth layer 18 may be an organic material, an inorganic material, or both. In one example, the sixth layer 18 comprises a glass—e.g., silica. In one example, the sixth layer 18 comprises at least one sensor—e.g., a touch sensor (e.g., force sensor).

As noted above, the article may comprise more than six layers. For example, FIG. 1E shows an example configuration of the article described herein, where the article comprises both the layer 17 as described in FIG. 1C and layer 18 as described in FIG. 1D. Other configurations, including ones with additional layers are also possible.

It is noted that each of the different layers described herein may be disposed to the extent that the layer has a certain thickness. However, the thickness need not be of any value and may vary depending on the application. In one example, the thickness is in the centimeter scale. In one example, the thickness is in the millimeter scale. In one example, the thickness is in the micrometer scale. For example, the thickness may be less than or equal to about 5 cm—e.g., less than or equal to about 4 cm, about 3 cm, about 2 cm, about 1 cm, about 500 µm, about 300 µm, about 200 pm, about 100 µm, about 50 µm, about 25 µm, about 20 µm, about 15 µm, about 10 µm, or smaller. In one example, the thickness is between about 100 µm and about 1000 µm—e.g., between about 200 µm and about 800 µm, between about 400 µm and about 600 µm, etc. Other thickness values, including those larger than about 5 cm, are also possible. The thickness values of the different layers may be the same as, or may be different from, one another. In one example, at least some of the layers have the same thickness value. In another example, all of the layers have different thickness values from one another.

Method of Manufacturing

The articles described herein may be manufactured by any suitable method involving any suitable number of processes. FIG. 3 illustrates the processes involved in one example method of manufacturing the article described herein.

As shown in FIG. 3, the method of manufacturing may comprise forming an article (S301). The process of forming may comprise disposing over at least a portion of a substrate a first layer, the first layer comprising a reflector. The substrate, the first layer, and the reflector may be any of those described herein. The process of forming may further comprise disposing over at least a portion of the first layer a second layer, the second layer comprising an electrode. The second layer and the electrode may be any of those described herein. The process of forming may further comprise disposing over at least a portion of the second layer a third layer, the third layer comprising a polymer and a light source. The third layer, the polymer, and the light source may be any of those described herein. The process of forming may further comprise disposing over at least a portion of the third layer a fourth layer, the fourth layer comprising a diffusor. The fourth layer and the diffusor may be any of those described herein. The process of forming may further comprise disposing over at least a portion of the fifth layer a fourth layer, the fifth layer comprising at least one of a photochromic material and a thermochromic material. The fifth layer, the photochromic material, and the thermochromic material may be any of those described herein.

Each of the disposing processes described here may involve any suitable deposition or coating techniques. For example, the disposing process may involve at least one of spray coating, screen printing, ink-jet printing, three-dimensional ("3D") printing, and roller coating. For example, the disposing process may involve at least one of physical vapor deposition ("PVD"), sol-gel method, pulsed laser deposition ("PLD"), chemical vapor deposition ("CVD"), atmospheric pressure chemical vapor deposition ("APCVD"), and "aerosol assisted chemical vapor deposition ("AACVD"). Other techniques are also possible.

As shown in FIG. 3, the method of manufacturing may further comprise assembling the article (as formed in S301) with a display to form an electronic device (S302). Although not shown, additional process(es), such as one to form the additional layer(s) as described herein may also be employed as a part of the forming process. For example, the method of manufacturing may further comprise a cleaning process, including removing debris from a surface and/or degreasing.

Applications

The articles and the methods of manufacturing same described herein may be employed in various applications. For example, the article may be an integral part of a structural component. The component may be a part of an electronic device. An electronic device here may refer to a computer, a memory storage, a display, a signal transmitting device, and the like. A computer may refer to a desktop, a laptop, a tablet, a phablet, a tablone, and the like. A storage unit may refer to the hardware of a hard drive, a server, a processor, and the like. A display may refer to a monitor, a liquid crystal display ("LCD"), a television, and the like. A signal transmitting device may refer to a device transmitting any type of signal, including light, sound, heat, and the like. In one example, the electronic device is a wearable device. For example, the electronic device may be a watch with the functionality of a mobile processor—e.g., computer, for example, embedded in a display.

Figure 4:
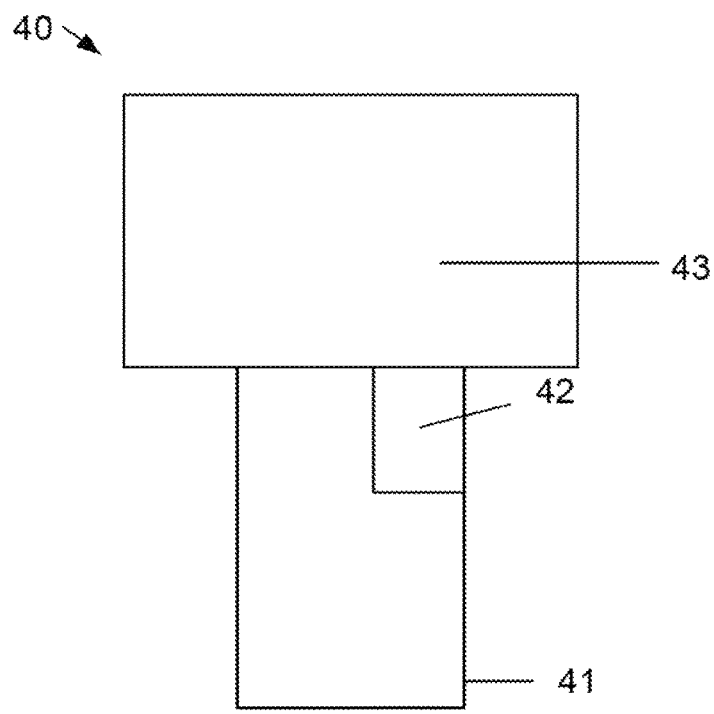
FIG. 4 shows, in one example, a schematic of an electronic device containing the article described herein.

The article described may be a part of the band of a wearable electronic device. FIG. 4 shows, in one example, a schematic of an electronic device 40 comprising a display 43 and a structural component 41 comprising an article 42, including any of the articles described herein. In one example, the structural component 41 is a band of a wearable electronic device, which band allows the electronic device to be fastened onto a users body—e.g., hand, wrist, arm, leg, etc.

Additional Notes

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

The indefinite articles "a" and "an," as used herein in this disclosure, including the claims, unless clearly indicated to the contrary, should be understood to mean "at least one." Any ranges cited herein are inclusive.

The terms "substantially" and "about" used throughout this disclosure, including the claims, are used to describe and account for small fluctuations, such as due to variations in processing. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Concentrations, amounts, and other numerical data may be expressed or presented herein in a range format. Such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "1 weight % (wt %) to 5 wt %" should be interpreted to include not only the explicitly recited values of 1 wt % to 5 wt %, but also include individual values and sub-ranges within the indicated range. Thus, included in this numerical range are individual values, such as 2, 3.5, and 4, and sub-ranges, such as from 1-3, from 2-4, and from 3-5, etc. This same principle applies to ranges reciting only one numerical value. Furthermore, such an interpretation should apply regardless of the breadth of the range or the characteristics being described.

The phrase "and/or," as used herein in this disclosure, including the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one example, to A only (optionally including elements other than B); in another example, to B only (optionally including elements other than A); in yet another example, to both A and B (optionally including other elements); etc.

As used in this disclosure, including the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in this disclosure, including the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

In this disclosure, including the claims, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, § 2111.03.

What is claimed:

1. An article, comprising:
    flexible substrate;
    a first layer disposed over at least a portion of the substrate, the first layer comprising a reflector;

a second layer disposed over at least a portion of the first layer, the second layer comprising an electrode;

a third layer disposed over at least a portion of the second layer, the third Dyer comprising a polymer and a light source;

a fourth layer disposed over at least a portion of the third layer, the fourth layer comprising a diffusor; and a fifth layer disposed over at least a portion of the fourth layer, the fifth layer comprising at least one of a photochromic material and a thermochromic material.

2. The article of claim 1, wherein the substrate comprises at least one of a polyurethane ("PU"), a polyethylene terephthalate ("PET"), a polyethylene naphthalate ("PEN"), a polyimide ("PI"), a synthetic paper, a polycarbonate, a polyacrylic, a poly(ether sulfone), a rubber, a polyolefin, and an elastic polymer.

3. The article of claim 1, wherein the reflector comprises a polymer that is one of a polyethylene terephthalate ("PET"), an acrylic, and a polyester, which polymer is coated with nanoparticles.

4. The article of claim 1, wherein the electrode comprises at least one of a conductive polymer layer, a graphene layer, a metal-containing mesh, and a plurality of metal-containing wires.

5. The article of claim 1, wherein the polymer comprises at least one of an acrylic, a polycarbonate, an epoxy, a silicone, an epoxy/silicone mixture, a urea resin, a polymethylmethacrylate ("PMMA"), a polycarbonate, an olefin polymer, and an acrylic-polystyrene copolymer.

6. The article of claim 1, wherein
the light source comprises one of:
at least one diode disposed over a first side of the third layer parallel the second layer; and
at least one diode disposed over a second side of the third layer perpendicular to the first side; and
the diode is one of a light-emitting diode ("LED") and an organic light-emitting diode ("OLED").

7. The article of claim 1, wherein the diffusor comprises at least one of a polycarbonate and a polyethylene terephthalate ("PET") having a plurality of optical beads attached thereto.

8. The article of claim 1, wherein:
the photochromic material comprises at least one of a spiropyran, a spirooxazine, and a naphthopyran; and
the thermochromic material comprises at least one of an N-acyl leuco-methylene blue derivative, a fluoran dye, a fulgide, a spirolactone, a crystal violet lactone analogue, a diphenylmethane compound, a spiropyran compound, a 1,2,3-benzotriazole, a dibenzotriazole, a thiourea, a saccharin or a derivative thereof, a halohydrins boric acid or a derivative thereof, a guanidme derivative, a 4-hydroxy coumarin derivative, a cholesteric liquid crystal, a chiral nematic liquid crystal; and vanadium (IV) oxide containing an impurity agent that is at least one of tungsten oxide, niobium (V) oxide, molybdenum (VI) oxide, gold, zinc oxide, cerium oxide, titanium oxide, and fluorine.

9. The article of claim 1, further comprising a sixth layer disposed over at least a portion of the fifth layer, the sixth layer comprising at least one of a polyethylene terephthalate ("PET"), a polyethylene naphthalate ("PEN"), a polyethylene ("PE"), a polypropylene ("PP"), a polyethersulfone ("PES"), a polyimide ("PI"), and a polystyrene ("PS").

10. The article of claim 1, wherein:
the light source of the third layer comprise a plurality of discrete diode; and
the at least one of photochromic material and thermochromic material of the fifth layer comprises a plurality of discrete designs, each separated by at least one of the plurality of discrete diodes.

11. An electronic device, comprising:
a display;
a flexible article connected to the display, the article comprising:
a flexible substrate;
a first layer disposed over at least a portion of the substrate, the first layer comprising a reflector;
a second layer disposed over at ea a portion of the first layer, the second layer comprising an electrode;
a third layer disposed over at least a portion of the second layer, the third layer comprising a polymer and a light source;
a fourth layer disposed over at least a portion of the third layer, the fourth layer comprising a diffusor; and
a fifth layer disposed over at least a portion of the fourth layer, the fifth layer comprising at least one of a photochromic material and a thermochromic material.

12. The electronic device of claim 11, wherein the reflector comprises at least one polymeric layer and has a reflectance of greater than or equal to 90%.

13. The electronic device of claim 11, wherein the polymer in the third layer comprises one of
an optically clear adhesive or resin comprising at least one of an acrylic, a polycarbonate, an epoxy, a silicone, an epoxy/silicone mixture, and a urea resin; and
a light guide plate comprising at least one of a polymethylmethacrylate ("PMMA"), a polycarbonate, an olefin polymer, and an acrylic-polystyrene copolymer.

14. The electronic device of claim 11, further comprising, a sixth layer between at least a portion of the fourth layer and a portion of the fifth layer, the sixth layer comprising at least one of a touch sensor and a glass.

15. A method of manufacturing, comprising
forming an article by:
disposing over at least a portion of a substrate a first layer, the first layer comprising a reflector;
disposing over at least a portion of the first layer a second layer, the second layer comprising an electrode;
disposing over at least a portion, of the second layer a third layer, the third layer comprising a polymer and a light source;
disposing over at least a portion of the third layer a fourth layer, the fourth layer comprising a diffusor; and
disposing over at least a portion of the fifth layer a fourth layer, the fifth layer comprising at least one of a photochromic material and a thermochromic material; and
assembling the article with a display to an electronic device.

* * * * *

UNITED STATES PATENT AND TRADEMARK OFFICE
CERTIFICATE OF CORRECTION

PATENT NO. : 10,170,712 B2
APPLICATION NO. : 15/563969
DATED : January 1, 2019
INVENTOR(S) : Wei Kuang Chu et al.

Page 1 of 1

It is certified that error appears in the above-identified patent and that said Letters Patent is hereby corrected as shown below:

In the Claims

In Column 8, Lines 64-65, Claim 1, after "comprising:" insert -- a --.

In Column 9, Line 4, Claim 1, delete "Dyer" and insert -- layer --, therefor.

In Column 9, Line 47, Claim 8, delete "spirolactone" and insert -- spironolactone --, therefor.

In Column 9, Line 51, Claim 8, delete "guanidme" and insert -- guanidine --, therefor.

In Column 10, Line 2, Claim 10, delete "comprise" and insert -- comprises --, therefor.

In Column 10, Line 3, Claim 10, delete "diode;" and insert -- diodes; --, therefor.

In Column 10, Line 15 approx., Claim 11, delete "ea" and insert -- least --, therefor.

In Column 10, Line 40 approx., Claim 14, delete "comprising," and insert -- comprising --, therefor.

In Column 10, Line 50 approx., Claim 15, delete "portion," and insert -- portion --, therefor.

In Column 10, Line 60 approx., Claim 15, after "to" insert -- form --.

Signed and Sealed this
Sixteenth Day of April, 2019

Andrei Iancu
*Director of the United States Patent and Trademark Office*